United States Patent
Goller et al.

(10) Patent No.: US 6,446,791 B1
(45) Date of Patent: Sep. 10, 2002

(54) FEEDER FOR TAPED SMD COMPONENTS

(75) Inventors: Hugo Goller; Ralf Schulz, both of Munich (DE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 09/913,530

(22) PCT Filed: Feb. 15, 2000

(86) PCT No.: PCT/DE00/00434

§ 371 (c)(1),
(2), (4) Date: Aug. 14, 2001

(87) PCT Pub. No.: WO00/49848

PCT Pub. Date: Aug. 24, 2000

(30) Foreign Application Priority Data

Feb. 15, 1999 (DE) .......................... 199 06 222

(51) Int. Cl.⁷ ............................... B65G 23/28
(52) U.S. Cl. ................................... 198/832.1
(58) Field of Search .............................. 198/832, 832.1, 198/834

(56) References Cited

U.S. PATENT DOCUMENTS

| | | | | |
|---|---|---|---|---|
| 3,263,316 A | * | 8/1966 | Schrader | 198/832.1 |
| 3,633,718 A | * | 1/1972 | Wanner et al. | 198/832.1 |
| 6,164,437 A | * | 12/2000 | Brown et al. | 198/832.1 |

FOREIGN PATENT DOCUMENTS

| | | |
|---|---|---|
| DE | 37 10 310 | 10/1988 |
| EP | 0 589 275 | 5/1995 |

OTHER PUBLICATIONS

DIN IEC 286, Sep. 1987, pp. 1–8.

* cited by examiner

*Primary Examiner*—James R. Bidwell
(74) *Attorney, Agent, or Firm*—Harness, Dickey & Pierce PLC.

(57) ABSTRACT

The transport wheel of the feed device is driven by a drive motor in such a manner that one revolution of the drive motor produces a transport movement of the tape which corresponds to a fraction of the pitch of the component compartments in the tape. Before the drive motor has completed a predetermined number of revolutions, a stop is applied, which stops the motor exactly when the next complete revolution has been completed.

2 Claims, 1 Drawing Sheet

FIG. 1A
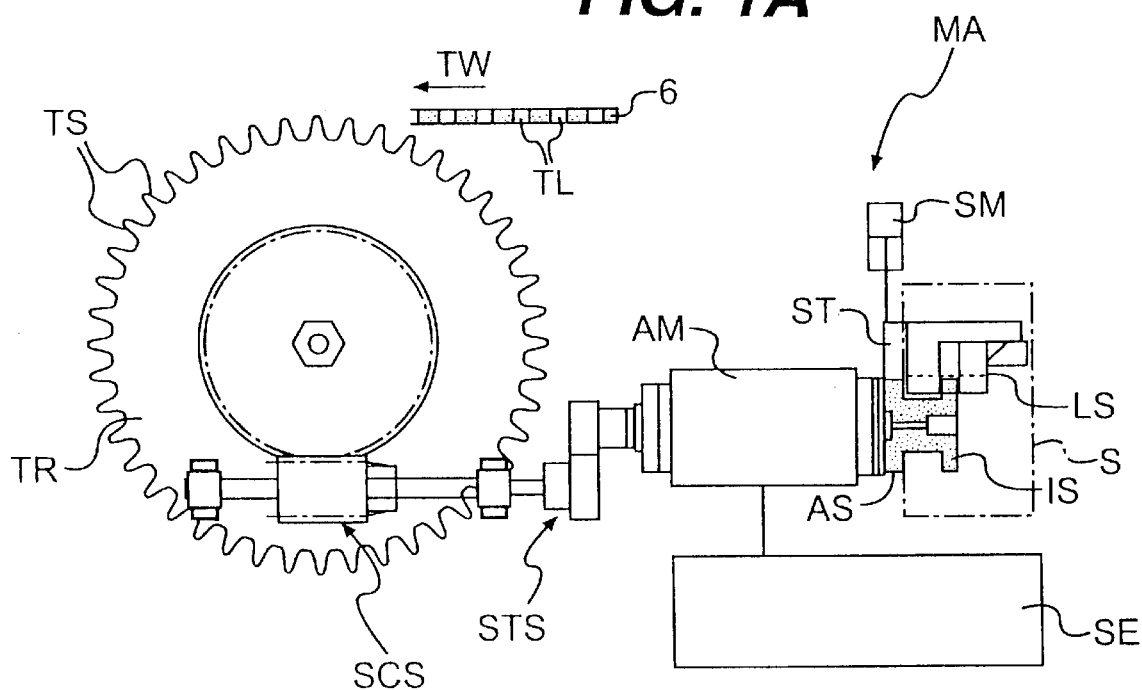
FIG. 1
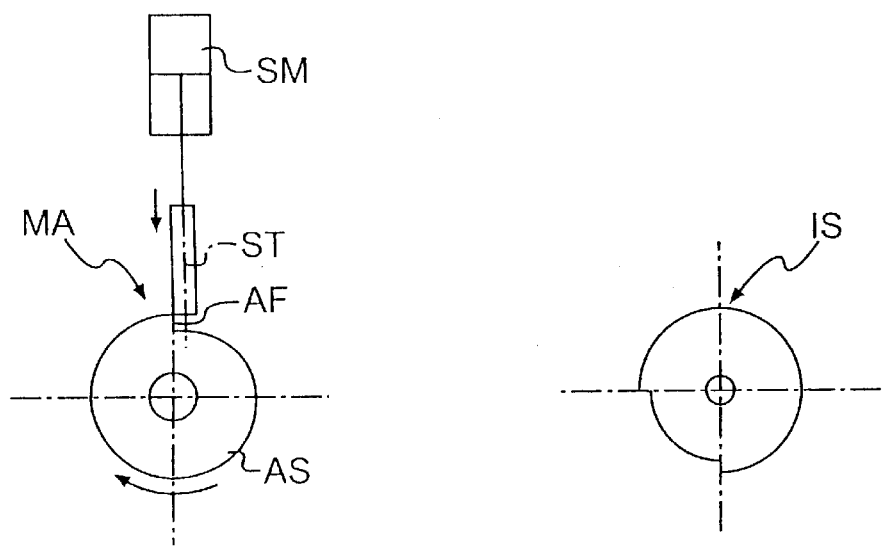
FIG. 2
FIG. 3

FEEDER FOR TAPED SMD COMPONENTS

BACKGROUND OF THE INVENTION

In the case of the automatic placement of surface mounted components, so-called SMD components, on printed circuit boards, the components are provided via various types of feed devices. The provision of taped components have a particular importance in this case. The form of delivery in a tape (cf. DIN IEC 286, September 1987) is particularly convenient for automation since the components are already separated and the packaging in a tape ensures a high level of protection against confusion. In the individual feed devices for taped components, the tapes with the components are unwound from a tape spool and are then fed to a removal position for the components. In the removal position, the components are then held by the suction pipette of a placement head and are set down in the predetermined placement position on a printed circuit board (cf. EP-A-0 013 977 and EP-A-0 016,368). In order to provide the components in the correct removal position, the tape is driven with the aid of a transport wheel whose transport pins engage in the transport holes in the tape. Since the SMD components are of smaller and smaller size and, in addition, the aim is to achieve placement performances which are as good as possible, feed devices for taped SMD components are subject to the following main requirements:

- positioning accuracy which is as high as possible;
- transportation times which are as short as possible; and
- tape transport optionally for a 4 mm pitch and a 2 mm pitch of the component compartments in the tape.

A feed device which satisfies these requirements is known from EP 0 589 275 B1. Modem automatic component replacement machines are achieving increasing cycle frequencies for picking up and fitting components. If, for example in the case of a revolver or turret placement head, a number of suction pipettes can be filled with identical components, and the latter must be taken from the tape as quickly as possible, in order to approach the pick-up performance of the placement head.

Furthermore, DE 37 10 310 A1 discloses a feed device for components, in which a magnetically operable catch engages in a tooth system on a supply spool, and in each case allows this to move onward through one feed cycle.

SUMMARY OF THE INVENTION

The invention is based on the object of speeding up the process of removing components from the component tape even further.

This object is achieved by an improvement of a feed device for components which are mounted in component compartments on a tape at a pitch spacing, the tape having transport holes arranged at the pitch spacing, the device including a transport wheel having transport pins engageable in the transport holes of the tape, at least one drive motor for driving the transport wheel in such a manner that a whole number of revolutions of the drive motor to an annular position produces a transport movement of the tape which corresponds to one pitch spacing, a sensor for detecting the number of revolutions of the drive motor, a stop surface which is connected to the rotor of the drive motor and is positioned transversely with respect to a radial direction, a mechanical stop which acts against the stop surface and stops the rotation of the drive motor in the annular position corresponding to one complete revolution of the drive motor to shift the tape one pitch spacing. The improvement comprises an active control element to lift the stop off the stop surface at the start of the feed rotation of the drive motor and to push the stop into a movement path of the stop surface before the end of the desired complete rotation so that the rotary movement can be continued toward the annular position until the stop position on the stop surface is reached.

The active stop now allows the position of the drive to be fixed directly during forward movement, without any reversal of the rotation direction, with the corresponding loss of time, being required for this purpose. The stop can be operated, for example, by a pneumatic control element, as is used, for example, for opening and closing a pick-up window for the components. If it is operated, for example, in synchronism with the pick-up window, there is no need for the stop to have its own control valve.

A development of the invention has the mechanical stop in the form of a radially movable pin and the stop surface is on a stop disk and this development makes reliable implementation of the mechanical stop possible at a low cost.

An exemplary embodiment of the invention is described in more detail in the following text, and is illustrated in the drawings.

BRIEF DESCRIPTION OF THE DRAWINGS

FIG. 1 shows a greatly simplified schematic illustration of the fundamental principle of a feed device for taped components;

FIG. 1A is a plan view of a tape with the transport holes;

FIG. 2 shows the mechanical stop of the drive motor of the feed device illustrated in FIG. 1; and FIG. 3 shows the indexing disk of the sensor for detecting the number of revolutions of the drive motor of the feed device illustrated in FIG. 1.

DESCRIPTION OF THE PREFERRED EMBODIMENTS

FIG. 1 shows the drive principle of a feed device for tapes SMD components. The transport pins TS of a transport wheel TR are dimensioned in such a manner that, for step by step transportation of a tape G, they can engage in transport holes TL of the tape G. In the illustrated exemplary embodiment, the transport holes TL of the tape G are arranged at a pitch separation of 4 mm.

The transport wheel TR is driven via a spur gear stage STS and a worm gear stage SCS whose step-up ratios are selected in such a manner that one complete revolution of the drive motor AM produces a transport movement TW of the tape G of 2 mm. In other words, this means that two revolutions of the drive motor AM produce a rotation of the transport wheel TR through the pitch separation of the transport pins TS and thus a transport movement TW of the tape G which corresponds to one pitch separation of the transport holes TL of the tape G of 4 mm.

The stop wheel or disk AS of a mechanical stop MA, and the indexing disk IS of a sensor S for detecting the number of revolutions of the drive motor AM are arranged on an end of a drive shaft of the rotor of the drive motor AM which is opposite the end of the shaft having the spur gear stage STS and the drive shaft is not shown in more detail. The mechanical stop MA whose method of operation can be seen in particular in FIG. 2, comprises a radially movable pin ST as well as the stop disk AS. The indexing disk IS of the sensor S comprises a light barrier LS which interacts with the stop MA. The form of the indexing disk IS can be seen from the plan view which is shown in FIG. 3.

The drive motor AM is controlled via a control device SE which, for its part, is connected to the sensor S.

In the case of a grid pitch of the component compartments of the tape G of 2 mm, the drive motor AM is switched on after removal of an SMD component with the pin ST being pulled out of the circumferential region of the stop disk AS. The tape G is in this case transported analogously to the rotation position of the motor. Each complete revolution is signaled by the sensor S to the control device SE. Before completion of the final or first revolution, the control device SE causes the control element SM to push the pin ST into the movement path of the stop disk AS. In consequence, a stop surface AF moves against the pin ST once before the full revolution has been completed, after which the control device SE switches off the drive motor by reducing the current fed to the drive motor AM to zero following an exponential function. In this position which is defined by the mechanical stop MA, the transport movement TW of the tape G is exactly 2 mm, and the next full component compartment is located precisely in the desired removal position.

In the case of a grid pitch of the component compartments of the tape G of for example 4 mm, which take two revolutions of the motor AM, the drive motor AM is switched on after removal of an SMD component. After completion of the penultimate revolution and before completion of the final or second revolution, the sensor S of the control device SE sets the brake by moving the pin ST into the path of the stop disk to limit the drive motor AM to two revolutions. As soon as the stop disk AS has reached the position of the last full revolution illustrated in FIG. 2, the pin ST engages and stops the drive motor AM, which is turned off immediately thereafter. In this position which is defined by the mechanical stop MA, the transport movement TW of the tape G is exactly 4 mm, and the next full component compartment is located precisely in the desired removal position.

We claim:

1. In a feed device for components on a tape at a pitch spacing, said tape having transport holes, the device including a transport wheel having transport pins engaged in the transport holes of the tape, at least one drive motor which drives the transport wheel so that a whole number of revolutions of the drive motor produces a transport movement of the tape which corresponds to one pitch spacing, a sensor for detecting a number of revolutions of the drive motor, a stop surface which is connected to a rotor shaft of the drive motor and is positioned transversely with respect to a radial direction and a mechanical stop which acts against the stop surface and stops the rotation of the drive motor in an annular position corresponding to a complete revolution of the drive motor to shift the tape one pitch spacing, the improvements comprising an active control element for shifting the stop from a position off of the stop surface at the start of the feed rotation of the drive motor and for pushing the stop into the movement path of the stop surface before the end of a complete revolution so that the rotary movement toward the annular position can be continued until the stop position of the stop surface is reached.

2. In a feed device according to claim 1, wherein the mechanical stop is formed by a radially movable pin and the stop surface is provided on a stop disk.

* * * * *